United States Patent
Lin et al.

(10) Patent No.: US 10,168,913 B2
(45) Date of Patent: Jan. 1, 2019

(54) DATA STORAGE DEVICE AND DATA MAINTENANCE METHOD THEREOF

(71) Applicant: Silicon Motion, Inc., Jhubei, Hsinchu County (TW)

(72) Inventors: Chien-Cheng Lin, Yilan (TW); Jie-Hao Lee, Keohsiung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 74 days.

(21) Appl. No.: 15/618,224

(22) Filed: Jun. 9, 2017

(65) Prior Publication Data
US 2017/0364265 A1    Dec. 21, 2017

(30) Foreign Application Priority Data
Jun. 21, 2016    (TW) .............................. 105119404 A

(51) Int. Cl.
*G06F 3/06*    (2006.01)
*G06F 12/02*    (2006.01)

(52) U.S. Cl.
CPC .............. *G06F 3/061* (2013.01); *G06F 3/064* (2013.01); *G06F 3/0614* (2013.01); *G06F 3/0655* (2013.01); *G06F 3/0679* (2013.01); *G06F 3/0688* (2013.01); *G06F 12/0246* (2013.01); *G06F 2212/7201* (2013.01)

(58) Field of Classification Search
CPC .......... G11C 2211/5641; G11C 16/107; G11C 2211/5648; G06F 12/0246; G06F 3/0679; G06F 11/1072; G06F 11/1068; G06F 3/0688; G06F 2212/214; G06F 2212/222; G06F 2212/202; G06F 2212/2022
See application file for complete search history.

(56) References Cited

U.S. PATENT DOCUMENTS

| | | | |
|---|---|---|---|
| 2013/0311705 A1 | 11/2013 | Cheng et al. | |
| 2015/0277793 A1* | 10/2015 | Yonezawa | G11C 29/52 714/764 |
| 2016/0284393 A1* | 9/2016 | Ramalingam | G11C 11/5628 |

FOREIGN PATENT DOCUMENTS

TW    201349099 A    12/2013

* cited by examiner

*Primary Examiner* — Reginald G Bragdon
*Assistant Examiner* — Thanh D Vo
(74) *Attorney, Agent, or Firm* — McClure, Qualey & Rodack, LLP

(57) ABSTRACT

The present invention provides a data storage device including a flash memory and a controller. The flash memory has a plurality of SLC-spare blocks, a plurality of TLC-data blocks and a plurality of TLC-spare blocks. The controller writes a first data sector into a first TLC-spare block, and determines whether a first TLC-data block corresponding to a first logical address has valid data. When the first TLC-data block has valid data, the controller performs a reverse-lookup to obtain a second logical address corresponding to the first TLC-data block, releases the first TLC-data block, a second TLC-data block and a third TLC-data block which are mapped to the second logical address, and maps the first TLC-spare block to the first logical address.

14 Claims, 6 Drawing Sheets

| logic address | TLC-data block |
|---|---|
| H_1 | F_1 |
| H_2 | F_2 |
| ⋮ | ⋮ |
| H_N/3 | F_N/3 |
| H_N/3+1 | F_N/3+1 |
| H_N/3+2 | F_N/3+2 |
| ⋮ | ⋮ |
| H_2N/3 | F_2N/3 |
| H_2N/3+1 | F_2N/3+1 |
| H_2N/3+2 | F_2N/3+2 |
| ⋮ | ⋮ |
| H_N-1 | F_N-1 |

DATA STORAGE DEVICE AND DATA MAINTENANCE METHOD THEREOF

CROSS REFERENCE TO RELATED APPLICATIONS

This application claims priority of Taiwan Patent Application No. 105119404, filed on Jun. 21, 2016, the entirety of which is incorporated by reference herein.

BACKGROUND OF THE INVENTION

Field of the Invention

The present invention is related to a data maintenance method for a data storage device, and in particular to a triple-level cell data maintenance method.

Description of the Related Art

Flash memory is considered a non-volatile data-storage device, using electrical methods to erase and program itself. NAND Flash, for example, is often used in memory cards, USB flash devices, solid state devices, eMMCs, and other memory devices.

Flash memory such as NAND Flash uses a multiple-block structure to store data, wherein flash memory uses floating gate transistors. The floating gates of the floating gate transistor may catch electronic charges for storing data. However, the electronics might undergo losses from the floating gate due to the operation of the flash memory or various environmental parameters, which can affect data retention. The Triple-Level Cell (TLC) of the flash memory is much more easily affected by the environment than a Single-Level Cell (SLC) or a Multi-Level Cell (MLC). It should be noted that the eMMC module is generally mounted on a motherboard. Therefore, the eMMC modules will pass through the high-temperature stove along with the motherboard, which might lead to data loss.

BRIEF SUMMARY OF THE INVENTION

A detailed description is given in the following embodiments with reference to the accompanying drawings.

An exemplary embodiment provides a data storage device including a flash memory and a controller. The flash memory has a plurality of SLC-spare blocks, a plurality of TLC-data blocks and a plurality of TLC-spare blocks. The controller receives a first data sector and a first logical address of the first data sector, writes the first data sector into a first TLC-spare block, and determines whether a first TLC-data block corresponding to the first logical address has valid data, wherein when the first TLC-data block has valid data, the controller further performs a reverse-lookup to obtain a second logical address corresponding to the first TLC-data block, releases the first TLC-data block, a second TLC-data block and a third TLC-data block which are mapped to the second logical address, and maps the first TLC-spare block to the first logical address.

Another exemplary embodiment provides a data maintenance method applied to a data storage device having a plurality of SLC-spare blocks, and a plurality of TLC-data blocks and a plurality of TLC-spare blocks. The data maintenance method includes: receiving a first data sector and a first logical address of the first data sector, writing the first data sector into a first TLC-spare block; determining whether a first TLC-data block corresponding to the first logical address has valid data; when the first TLC-data block has valid data, performing a reverse-lookup to obtain a second logical address corresponding to the first TLC-data block; releasing the first TLC-data block, a second TLC-data block and a third TLC-data block which are mapped to the second logical address; and mapping the first TLC-spare block to the first logical address.

BRIEF DESCRIPTION OF THE DRAWINGS

The present invention can be more fully understood by reading the subsequent detailed description and examples with references made to the accompanying drawings, wherein:

FIG. 3 is a schematic diagram illustrating logical addresses and a TLC-data block, constructed in accordance with an embodiment.

FIG. 4 is a schematic diagram illustrating mapping relationship of blocks, constructed in accordance with an embodiment.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
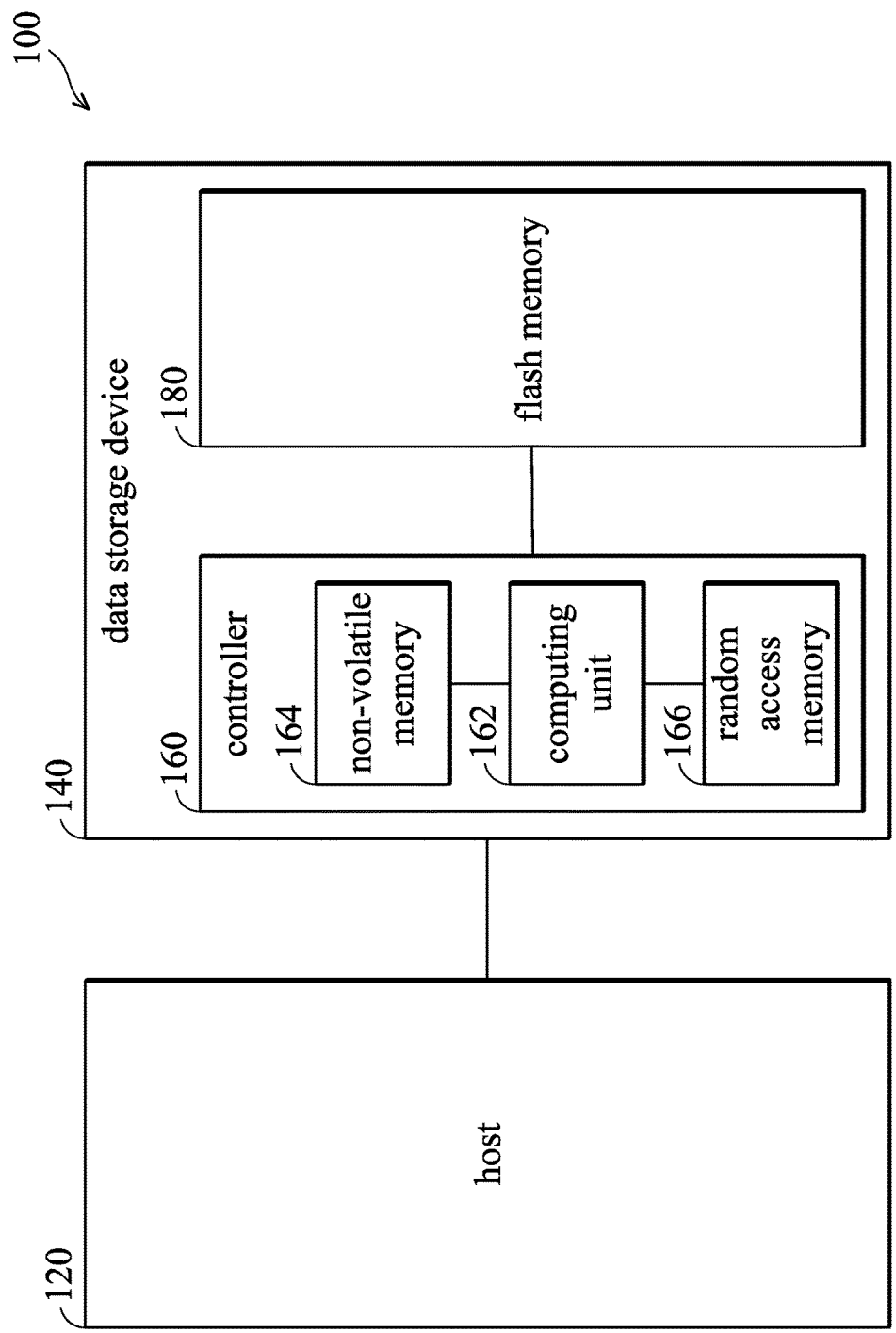
FIG. 1 is a schematic diagram illustrating an electronic system, constructed in accordance with an embodiment.

FIG. 1 is a schematic diagram illustrating an electronic system, constructed in accordance with an embodiment. The electronic system 100 includes a host 120 and a data storage device 140. The data storage device 140 includes a flash memory 180 and a controller 160, and operates in response to the commands of the host 120. The controller 160 includes a computing unit 162, a non-volatile memory 164 (ROM) and a random access memory 166 (RAM). The non-volatile memory 164, the program code stored in the non-volatile memory 164 and data stored in the non-volatile memory 164 constitute firmware executed by the processing unit 162, and the controller 160 is configured to control the flash memory 180 based on the firmware. The flash memory 180 includes a plurality of blocks, each of the blocks has a plurality of pages, wherein the minimum write unit of the flash memory 180 is a page, and the minimum erase unit of the flash memory 180 is a block.

Figure 2:
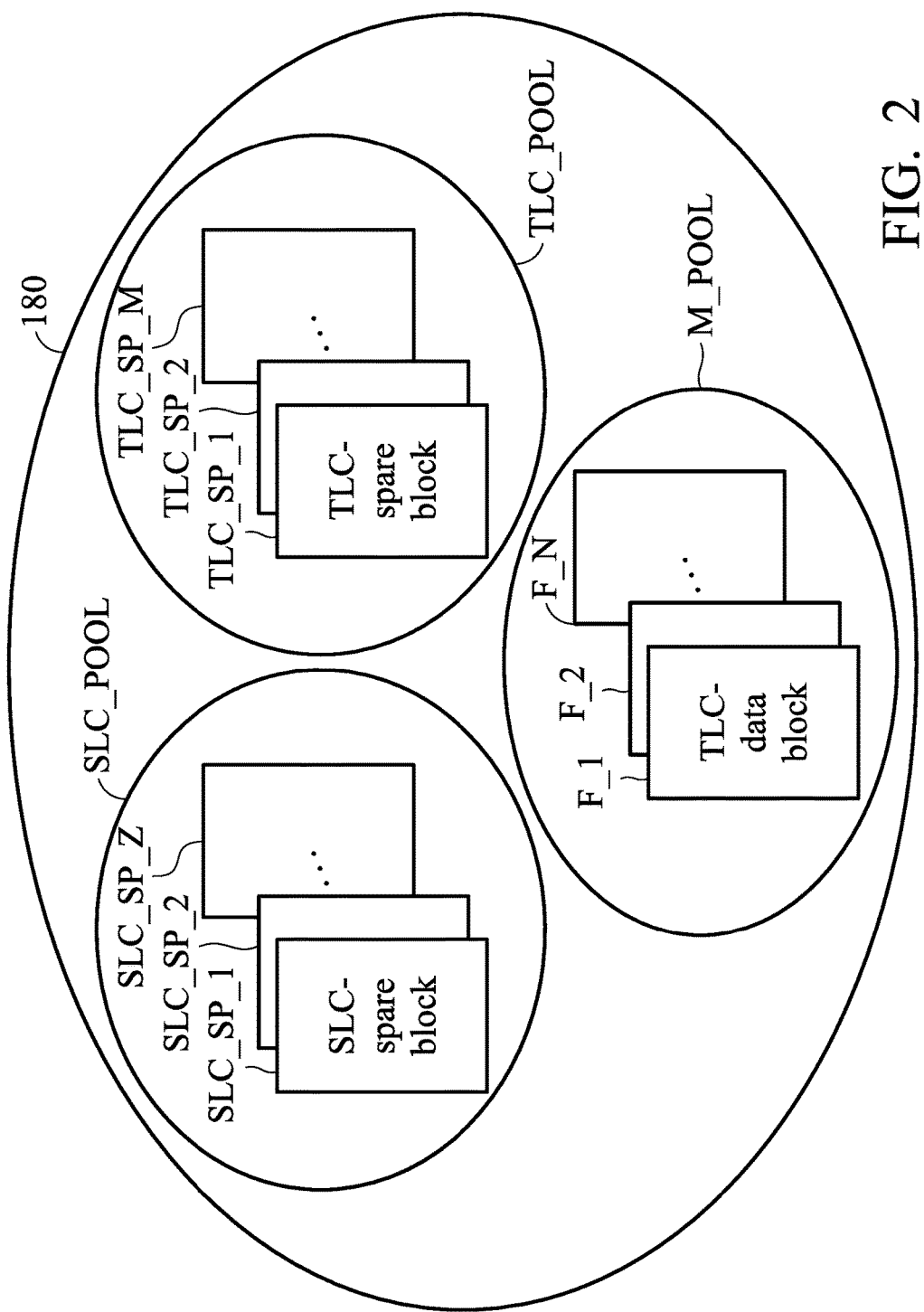
FIG. 2 is a schematic diagram illustrating a flash memory, constructed in accordance with an embodiment.

FIG. 2 is a schematic diagram illustrating a flash memory, constructed in accordance with an embodiment. As shown in FIG. 2, the flash memory 180 has an SLC-spare pool SLC_POOL, a TLC-spare pool TLC_POOL and a TLC-data pool M_POOL. The SLC-spare pool SLC_POOL includes a plurality of SLC-spare blocks SLC_SP_1~SLC_SP_Z, wherein "SLC" is the abbreviation of "Single-Level Cell", the total number of SLC-spare blocks is "Z", and the size of SLC-spare block is equal to a block, but it is not limited thereto. Namely, the SLC-spare blocks SLC_SP_1~SLC_SP_Z are the blocks of the flash memory 180 that are arranged to be written by the SLC storage mode.

It should be noted that the SLC-spare blocks SLC_SP_1~SLC_SP_Z of the SLC-spare pool SLC_POOL are arranged to store the data that is going to be programmed into the TLC-spare pool TLC_POOL. The TLC-spare pool TLC_POOL includes a plurality of TLC-spare blocks TLC_SP_0~TLC_SP_M, wherein "TLC" is the abbreviation of "Triple-Level Cell", the total number of SLC-spare blocks is "M", and the size of the TLC-spare block is equal to a block. Namely, the TLC-spare blocks TLC_SP_0~TLC_SP_M are the blocks of the flash memory 180 that are arranged to be written by the TLC storage mode. It should be noted that the TLC-spare pool TLC_POOL is arranged to provide the TLC-spare blocks TLC_SP_0~TLC_SP_M that are without valid data and available to be written, and the TLC-spare block which is written with valid data will be exchanged with a TLC-data block without valid data in the TLC-data pool M_POOL. The TLC-data pool M_POOL has a plurality of TLC-data blocks F_1~F_N, wherein "N" is the total number of SLC-spare blocks, and the size of the TLC-data block is equal to a block. Namely, the TLC-data blocks F_1~F_N are arranged to be written with valid data. It should be noted that the TLC-data pool M_POOL is arranged to provide memory space for users to store data. More specifically, the TLC-data blocks F_1~F_N are respectively assigned to a plurality of logical addresses H_1~H_N, wherein each of the TLC-data blocks F_1~F_N corresponds to one of the logical addresses H_1~H_N, as shown in FIG. 3. More specifically, the TLC-data block F_1 is assigned to the logical address H_1, the TLC-data block F_2 is assigned to the logical address H_2, the TLC-data block F_3 is assigned to the logical address H_3, the TLC-data block F_4 is assigned to the logical address H_4, and so on. Moreover, the TLC-data blocks F_1~F_N and the logical addresses H_1~H_N are arranged from top to bottom according to the addresses.

In one of the embodiments, the flash memory 180 operates by the Triple-Level Cell (TLC) mode. Namely, the TLC-data blocks F_1~F_N of the TLC-data pool M_POOL are Triple-Level Cells. It should be noted that, the triple-level cell is the storage cell obtained by programming a single-level cell. The memory space of the triple-level cell is three times the single-level cell. Although the memory space of the triple-level cell is larger than the single-level cell, the triple-level cell is much more easily affected by the environment, especially the flash memory of Embedded Multi Media Card (eMMC). The eMMC module will pass through the high-temperature stove along with the motherboard, meaning that the data stored in the eMMC module can easily become damaged by the high temperature of the stove. Therefore, the present invention provides a data storage device 140 that uses the TLC-data blocks F_1~F_N of the TLC-data pool M_POOL as a single-level cell to write the prewrite data sector into the TLC-data blocks F_1~F_N by SLC mode before passing through the stove (the first stage). It should be noted that, when the TLC-data blocks F_1~F_N of the TLC-data pool M_POOL are used as the single-level cell, the memory space of the TLC-data pool M_POOL will be decreased to one third of the TLC-data blocks F_1~F_N that are written by the TLC mode. Next, after passing through the stove (the second stage), the data storage device 140 can program the prewrite data sector written by the SLC mode in the TLC-data blocks F_1~F_N into triple-level cells. In one of the embodiments, the first stage is the Production Phase, the second stage, which is after the first stage, is the Integration Phase, and the data storage device goes through a high-temperature soldering event between the first stage and the second stage, but it is not limited thereto.

For example, when the controller 160 receives a prewrite data sector and a logical address of the prewrite data sector, the controller 160 is arranged to write the prewrite data sector into one of the logical addresses H_1~H_N according to the received logical address in the first stage. More specifically, in the present invention, the controller 160 can write the prewrite data sector into the logical address without the sequence of the logical addresses H_1~H_N. Namely, the controller 160 can write the prewrite data sectors in a way that is not in accordance with the order of the logical addresses.

In one of the embodiments, the controller 160 equally distributes the TLC-data blocks F_1~F_N into three regions, wherein the three regions have the same number of TLC-data blocks. More specifically, the controller 160 sequentially assigns the TLC-data blocks F_1~F_N into the regions R1~R3 to select at least one TLC-data block from the TLC-data blocks F_1~F_N to serve as the SLC-spare block noncontinuously, but it is not limited thereto. It should be noted that each of the TLC-data blocks F_1~F_N has an address, and the addresses of the TLC-data blocks F_1~F_N are in sequence. After the TLC-data blocks F_1~F_N are distributed into the regions R1~R3, the controller 160 divides the prewrite-data into a plurality of sub-prewrite data sectors and writes the sub-prewrite data sectors into the logical addresses. Namely, the data length of each of the sub-prewrite data sectors is equal to the data length of the triple-level cell and is three times the data length of the single-level cell. More specifically, the controller 160 selects three TLC-data blocks from the TLC-data blocks F_1~F_N according to a write command arranged to write the prewrite data sector into a specific logical address of the logical address H_1~H_N. Next, the controller 160 writes the sub-prewrite data sector into three TLC-data blocks by the SLC storage mode, and maps the selected three TLC-data blocks to the specific logical address (such as the first logical address).

It should be noted that, in the present invention, the mapping relationship and the assigning relationship of the TLC-data block, the new TLC-data block, and the logical address can be maintained by at least one mapping table. For example, the flash memory 180 has a first mapping table arranged to record the assigning relationships of the TLC-data blocks (the new TLC-data block) and the logical addresses. The flash memory 180 can further include a second mapping table arranged to record the mapping relationships of the TLC-data blocks (the new TLC-data block) which are written by the sub-prewrite data sectors and the logical addresses, wherein the TLC-data blocks (the new TLC-data block) which are written by the sub-prewrite data sectors can be directly mapped to the logical address or the TLC-data blocks (the new TLC-data block) which are written by the sub-prewrite data sectors can be mapped to the TLC-data blocks assigned to the logical addresses, but it is not limited thereto.

As shown in FIG. 4, in one embodiment, in the first stage, controller 160 divides a first prewrite data sector into a first sub-prewrite data sector, a second sub-prewrite data sector and a third sub-prewrite data sector according to a first write command arranged to write the first prewrite data sector to a logical address H_302 of the logical addresses H_1~H_N, and respectively writes the first sub-prewrite data sector, the second sub-prewrite data sector and the third sub-prewrite data sector of the first prewrite data sector into the TLC-data block F_302, the TLC-data block F_602 and the TLC-data block F_2 by an SLC storage mode, and maps the TLC-data block F_302, the TLC-data block F_602 and the TLC-data block F_2 to the logical address H_302. Next, still in the first stage, the controller 160 divides a second prewrite data sector into a first sub-prewrite data sector, a second sub-prewrite data sector and a third sub-prewrite data sector according to a second write command arranged to write the second prewrite data sector to a logical address H_604 of the logical addresses H_1~H_N, and respectively writes the first sub-prewrite data sector, the second sub-prewrite data sector and the third sub-prewrite data sector of the second prewrite data sector into the TLC-data block F_604, the TLC-data block F_4 and the TLC-data block F_304 by an SLC storage mode, and maps the TLC-data block F_604, the TLC-data block F_4 and the TLC-data block F_304 to the logical address H_604. Next, still in the first stage, the controller 160 divides a third prewrite data sector into a first sub-prewrite data sector, a second sub-prewrite data sector and a third sub-prewrite data sector according to a third write command arranged to write the third prewrite data sector to a logical address H_8 of the logical addresses H_1~H_N, and respectively writes the first sub-prewrite data sector, the second sub-prewrite data sector and the third sub-prewrite data sector of the third prewrite data sector into the TLC-data block F_8, the TLC-data block F_308 and the TLC-data block F_608 by an SLC storage mode, and maps the TLC-data block F_8, the TLC-data block F_308 and the TLC-data block F_608 to the logical address H_8. Next, in the first stage, the controller 160 divides a fourth sub-prewrite data sector into a first sub-prewrite data sector, a second sub-prewrite data sector and a third sub-prewrite data sector according to a fourth write command arranged to write the fourth prewrite data sector to a logical address H_2 of the logical addresses H_1~H_N, respectively writes the first sub-prewrite data sector, the second sub-prewrite data sector and the third sub-prewrite data sector of the fourth prewrite data sector into the TLC-data block F_1, the TLC-data block F_301 and the TLC-data block F_302 by the SLC storage mode, and maps the TLC-data block F_1, the TLC-data block F_301 and the TLC-data block F_302 to the logical address H_2.

However, in some of the embodiments, the TLC-data block is not mapped to the assigned logical address. Namely, the data stored in a specific TLC-data block is not corresponding to a specific logical address which is assigned to the specific TLC-data block. Therefore, when the user wants to write data into the specific logical address in the second stage, the controller 160 cannot push the specific TLC-data block which is assigned to the specific logical address into the TLC-spare pool TLC_POOL. For example, as shown in FIG. 4, the TLC-data block F_2 is assigned to the logical address H_2. However, the TLC-data block F_2 is written with the valid data of the logical address H_302. Namely, the TLC-data block F_2 is mapped to the logical address H_2 rather than the assigned logical address H_2.

In the second stage, the controller 160 receives a user write command arranged to write a data sector into a specific logical address from users, and determines whether the specific logical address has valid data according to the user write command. When the specific logical address has valid data, the controller 160 releases the three TLC-data blocks mapped to the specific logical address. More specifically, when the specific logical address has valid data and the user write command is arranged to update a specific logical address, the controller 160 locates the three TLC-data blocks mapped to the specific logical address, and selects a TLC-spare block from the TLC-spare pool TLC_POOL to program the data stored in the three TLC-data blocks mapped to the specific logical address into the selected TLC-spare block by the TLC storage mode. Next, the controller 160 temporally maps the programed TLC-spare block to the specific logical address until the TLC block, which is written with the data indicated by the user write command, is mapped to the specific logical address, such that the specific logical address will keep the original data if a power-off event occurs before the new data is written, but it is not limited thereto. In other embodiments, when the specific logical address has valid data and the user write command is arranged to update the specific logical address, the controller 160 may directly delete the mapping relationship between the three TLC-data blocks mapped to the specific logical address. Moreover, when the specific logical address does have valid data, the controller may skip the above steps and perform the next tasks, as shown below.

Next, the controller 160 selects a TLC-spare block from the TLC-spare pool TLC_POOL, and writes the data indicated by the user write command into the selected TLC-spare block. Next, the controller 160 further determines whether the TLC-data block which is assigned to the specific logical address (the TLC-data block corresponding to the specific logical address) has valid data for solving the previous problem of the TLC-data block assigning to the specific logical address already having valid data. Namely, the controller 160 determines whether the TLC-data block assigned to the specific logical address has been mapped to other logical addresses for solving the previous problem of the TLC-data block assigning to the specific logical address already having valid data. When the TLC-data block is assigned to a specific logical address, the controller 160 further performs a reverse-lookup to obtain the logical address corresponding to the TLC-data block, which is assigned to the specific logical address, and releases the three TLC-data blocks mapped to the logical address which corresponds to the TLC-data block assigned to the specific logical address. Namely, when the TLC-data block assigned to the specific logical address is mapped to another logical address, the controller 160 further performs a reverse-lookup to obtain the logical address mapped to the TLC-data block which is assigned to the specific logical address, and releases the three TLC-data blocks mapped to the logical address which corresponds to the TLC-data block assigned to the specific logical address. Next, the controller 160 exchanges the TLC-data block assigned to the specific logical address and the TLC-spare block written with valid data to map the TLC-spare block written with the valid data to the specific logical address and push the TLC-data block assigned to the specific logical address into the TLC-spare pool TLC_POOL. Moreover, when the TLC-data block assigned to the specific logical address does not have valid data, the controller 160 exchanges the TLC-data block assigned to the specific logical address and the written TLC-spare block to map the written TLC-spare block to the specific logical address and push the TLC-data block assigned to the specific logical address into the TLC-spare pool TLC_POOL.

It should be noted that, in some embodiments, the controller 160 writes the data indicated by the user command into three of the SLC blocks in the SLC-spare pool SLC_POOL by the SLC storage mode first, and programs the data stored in the three written SLC blocks into a selected TLC-spare block by the TLC storage mode after.

More specifically, the controller 160 receives a first user write command having a first logical address of the logical addresses H_1~H_N and a first data sector. For an example based on the embodiment of FIG. 4 and the first logical address is the logical address H_209, the controller 160 determines whether the first logical address H_209 has valid data according to the first user write command. In this embodiment, the first logical address H_209 does not have valid data. Namely, none of the TLC-data blocks is mapped to the first logical address H_209. Because the first logical address H_209 does not have valid data, the controller 160 selects a first TLC-spare block TLC_SP_1 from the TLC-spare pool TLC_POOL, and writes the first data sector into the selected first TLC-spare block TLC_SP_1. More specifically, the controller 160 writes the first data sector into a first SLC-spare block SLC_SP_1, a second SLC-spare block SLC_SP_2 and a third SLC-spare block SLC_SP_3 in the SLC-spare pool SLC_POOL by the SLC storage mode, and then writes the data stored in the first SLC-spare block SLC_SP_1, the second SLC-spare block SLC_SP_2 and the third SLC-spare block SLC_SP_3 into the selected first TLC-spare block TLC_SP_1 by the TLC storage mode. It should be noted that, the method of selecting the SLC-spare block and the TLC-spare block is not limited thereto. Next, the controller 160 determines whether a first TLC-data block F_209 assigned to the first logical address H_209 has valid data. Namely, the controller 160 determines whether a first TLC-data block F_209, which is assigned to the first logical address H_209, of the TLC-data blocks F_1~F_N is mapped to other logical addresses besides the first logical address H_209. In this embodiment, the first TLC-data block F_209 has not been written in the first stage. Namely, in this embodiment, the first TLC-data block F_209 is not mapped to other logical addresses besides the first logical address H_209. Therefore, the controller 160 can directly exchange the first TLC-data block F_209 which is assigned to the first logical address H_209 and the first TLC-spare block TLC_SP_1 which has the first data sector written within, such that the first TLC-spare block TLC_SP_1 written with the first data sector is mapped to the first logical address H_209, and the first TLC-data block F_209 assigned to the first logical address H_209 is pushed into the TLC-spare pool TLC_POOL.

In another embodiment of FIG. 4, the first logical address is the logical address H_304. The controller 160 determines whether the first logical address H_304 has valid data according to the first user write command. In this embodiment, the TLC-data block F_304 which is assigned to the first logical address H_304 has valid data, but the first logical address H_304 was not written with any data in the first stage. Namely, there is no TLC-data block mapped to the first logical address H_304. The first logical address H_304 does not have valid data, and so the next step of the controller 160 is selecting a first TLC-spare block TLC_SP_1 from the TLC-spare pool TLC_POOL and writing the first data sector into the selected first TLC-spare block TLC_SP_1, wherein the controller 160 writes the first data sector into a first SLC-spare block SLC_SP_1, a second SLC-spare block SLC_SP_2 and a third SLC-spare block SLC_SP_3 of the SLC-spare pool SLC_POOL by the SLC storage mode first, and programs the first data sector stored in the first SLC-spare block SLC_SP_1, the second SLC-spare block SLC_SP_2 and the third SLC-spare block SLC_SP_3 into the selected first TLC-spare block TLC_SP_1 by the TLC storage mode after. It should be noted that the method of selecting the SLC-spare block and the TLC-spare block is not limited thereto.

Next, the controller 160 determines whether a first TLC-data block F_304, which is assigned to the first logical address H_304, of TLC-data blocks F_1~F_N has valid data. Namely, the controller 160 determines whether the first TLC-data block F_304, which is assigned to the first logical address H_304, of TLC-data blocks F_1~F_N is mapped to other logical addresses besides the first logical address H_304. In this embodiment, the first TLC-data block F_304 has been written with the valid data of the second logical address H_604. Namely, the first TLC-data block F_304 is mapped to the second logical address H_604. Therefore, the controller 160 further performs a reverse-lookup on the first TLC-data block F_304 to obtain the second logical address H_604 which corresponds to the first TLC-data block F_304 from the logical addresses H_1~H_N. Namely, the controller 160 performs a reverse-lookup on the first TLC-data block F_304 to obtain the second logical address H_604 which is mapped to the first TLC-data block F_304. Next, the controller 160 programs the data stored in the first TLC-data block F_304, the second TLC-data block F_4 and the third TLC-data block F_604, which are mapped to the second logical address H_604, into another TLC-spare block (such as the second TLC-spare block TLC_SP_2) in the TLC-spare pool TLC_POOL by the TLC storage mode to release the first TLC-data block F_304, the second TLC-data block F_4 and the third TLC-data block F_604. Next, the controller 160 determines whether the TLC-data block F_604, which is assigned to the second logical address H_604, has valid data. Namely, the controller 160 determines whether the TLC-data block F_604, which is assigned to the second logical address H_604, is mapped to any logical address besides the second logical address H_604. In this embodiment, the third TLC-data block F_604 has been released when writing the second logical address H_604. Namely, the TLC-data block F_604 is not mapping to any logical address and does not have valid data. Therefore, the controller 160 exchanges the programed second TLC-spare block TLC_SP_2 and the TLC-data block F_604 assigned to the second logical address H_604 for mapping the programed second TLC-spare block TLC_SP_2 to the second logical address H_604 and pushing the TLC-data block F_604 assigned to the second logical address H_604 into the TLC-spare pool TLC_POOL. In the above steps, the controller 160 programed the second logical address H_604, and released the first TLC-data block F_304 which is assigned to the first logical address H_304 during programing the second logical address H_604.

Next, the controller 160 exchanges the first TLC-data block F_304 assigned to the first logical address H_304 and the first TLC-spare block TLC_SP_1 written with the first data sector to map the first TLC-spare block TLC_SP_1 written with the first data sector to the first logical address H_304 and push the first TLC-data block F_304 which is assigned to the first logical address H_304 into the TLC-spare pool TLC_POOL.

In yet another embodiment of FIG. 4, the first logical address is the logical address H_2. The controller 160 determines whether the first logical address H_2 has valid data according to the first user write command. In this embodiment, the first logical address H_2 has valid data. When the first logical address H_2 has valid data, the controller 160 releases the TLC-data block F_1, the TLC-data block F_301 and the TLC-data block F_601 which are mapped to the first logical address H_2. More specifically, when the first logical address H_2 has valid data and the user write command is arranged to update the first logical address H_2, the controller 160 locates the three TLC-data blocks (the TLC-data block F_1, the TLC-data block F_301 and the TLC-data block F_601) which are mapped to the first logical address H_2, selects a third TLC-spare block TLC_SP_3 from the TLC-spare pool TLC_POOL, and programs the data stored in the TLC-data block F_1, the TLC-data block F_301 and the TLC-data block F_601, which are mapped to the first logical address H_2, into the selected third TLC-spare block TLC_SP_3 by the TLC storage mode. Next, the controller 160 temporally maps the programed third TLC-spare block TLC_SP_3 to the first logical address H_2 until another TLC block, which is written with the data indicated by the user write command, is mapped to the specific logical address. Next, the controller 160 selects another first TLC-spare block TLC_SP_1 from the TLC-spare pool TLC_POOL, and writes the first data sector into the first TLC-spare block TLC_SP_1, wherein the controller 160 writes the first data sector into a first SLC-spare block SLC_SP_1, a second SLC-spare block SLC_SP_2 and a third SLC-spare block SLC_SP_3 in the SLC-spare pool SLC_POOL by the SLC storage mode first, and programs the data stored in the first SLC-spare block SLC_SP_1, the second SLC-spare block SLC_SP_2 and the third SLC-spare block SLC_SP_3 into the selected first TLC-spare block TLC_SP_1 by the TLC storage mode. It should be noted that the method of selecting the SLC-spare block and the TLC-spare block is not limited thereto.

Next, the controller 160 determines whether a first TLC-data block F_2, which is assigned to the first logical address H_2, of the TLC-data blocks F_1~F_N has valid data. Namely, the controller 160 determines whether the first TLC-data block F_2, which is assigned to the first logical address H_2, of the TLC-data blocks F_1~F_N is mapped to other logical addresses. In this embodiment, the first TLC-data block F_2 has been written with the valid data of the second logical address H_302. Namely, in this embodiment, the first TLC-data block F_2 is mapped to the second logical address H_302. Therefore, the controller 160 performs a reverse-lookup to obtain a second logical address H_302 corresponding to the first TLC-data block F_2 of the logical addresses H_1~H_N. Namely, the controller 160 performs a reverse-lookup on the first TLC-data block F_2 to obtain the second logical address H_302 mapped to the first TLC-data block F_2. Next, the controller 160 programs the data stored in the first TLC-data block F_2, the second TLC-data block F_302 and the third TLC-data block F_602, which are mapped to the second logical address H_302, into another TLC-spare block (such like the second TLC-spare block TLC_SP_2) in the TLC-spare pool TLC_POOL by the TLC storage mode to release the first TLC-data block F_2, the second TLC-data block F_302 and the third TLC-data block F_602. Next, the controller 160 determines whether the TLC-data block F_302 which is assigned to the second logical address H_302 has valid data. Namely, the controller 160 determines whether the TLC-data block F_302 which is assigned to the second logical address H_302 is mapped to any logical address. In this embodiment, the third TLC-data block F_302 is released when programing the second logical address H_302. Therefore, the controller 160 exchanges the programed second TLC-spare block TLC_SP_2 and the TLC-data block F_302 assigned to the second logical address H_302 to map the programed second TLC-spare block TLC_SP_2 to the second logical address H_302 and push the TLC-data block F_302 assigned to the second logical address H_302 into the TLC-spare pool TLC_POOL. In the above steps, the controller 160 programed the second logical address H_302, and released the first TLC-data block F_2 assigned to the first logical address H_2 during the process of programing the second logical address H_302.

Next, the controller 160 exchanges the first TLC-data block F_2 assigned to the first logical address H_2 and the first TLC-spare block TLC_SP_1 written with the first data sector to map the first TLC-spare block TLC_SP_1 with the first data sector to the first logical address H_2 and push the first TLC-data block F_2 assigned to the first logical address H_2 into the TLC-spare pool TLC_POOL.

Figure 5:
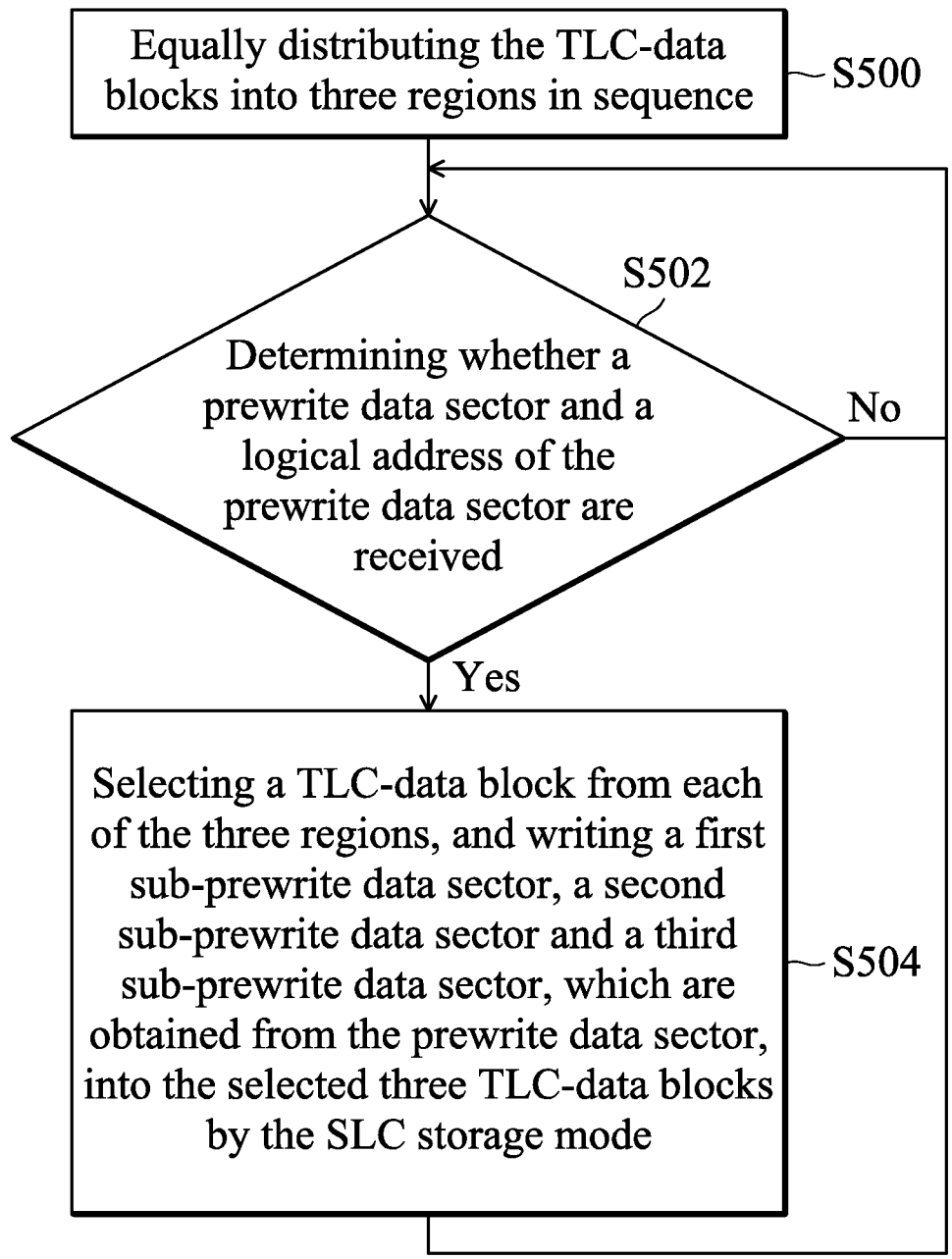
FIG. 5 is a flowchart of a data maintenance method constructed in accordance with an embodiment.

FIG. 5 is a flowchart of a data maintenance method constructed in accordance with an embodiment. The data maintenance method is applied to the data storage device 140 of FIG. 1, wherein the data maintenance method is arranged to write a prewrite data sector into at least one of the logical addresses H_1~H_N in a way that is not in accordance with the order of the logical addresses in the first stage. The process starts at step S600.

In step S500, the controller 160 equally distributes the TLC-data blocks F_1~F_N into three regions in sequence.

Next, in step S502, the controller 160 determines whether a prewrite data sector and a logical address of the prewrite data sector are received. When the controller 160 receives a prewrite data sector and a logical address, the process goes to step S604, otherwise the controller 160 continues to determine whether a prewrite data sector and a logical address of the prewrite data sector are received.

Next, in step S504, the controller 160 selects a TLC-data block from each of the three regions, and writes a first sub-prewrite data sector, a second sub-prewrite data sector and a third sub-prewrite data sector, which are obtained from the prewrite data sector, into the selected three TLC-data blocks by the SLC storage mode. Next, the process returns to step S502, the controller 160 continues to determine whether a write command, which is arranged to write another prewrite data sector into a specific logical address of the logical addresses H_1~H_N the prewrite data sector is received.

Figure 6:
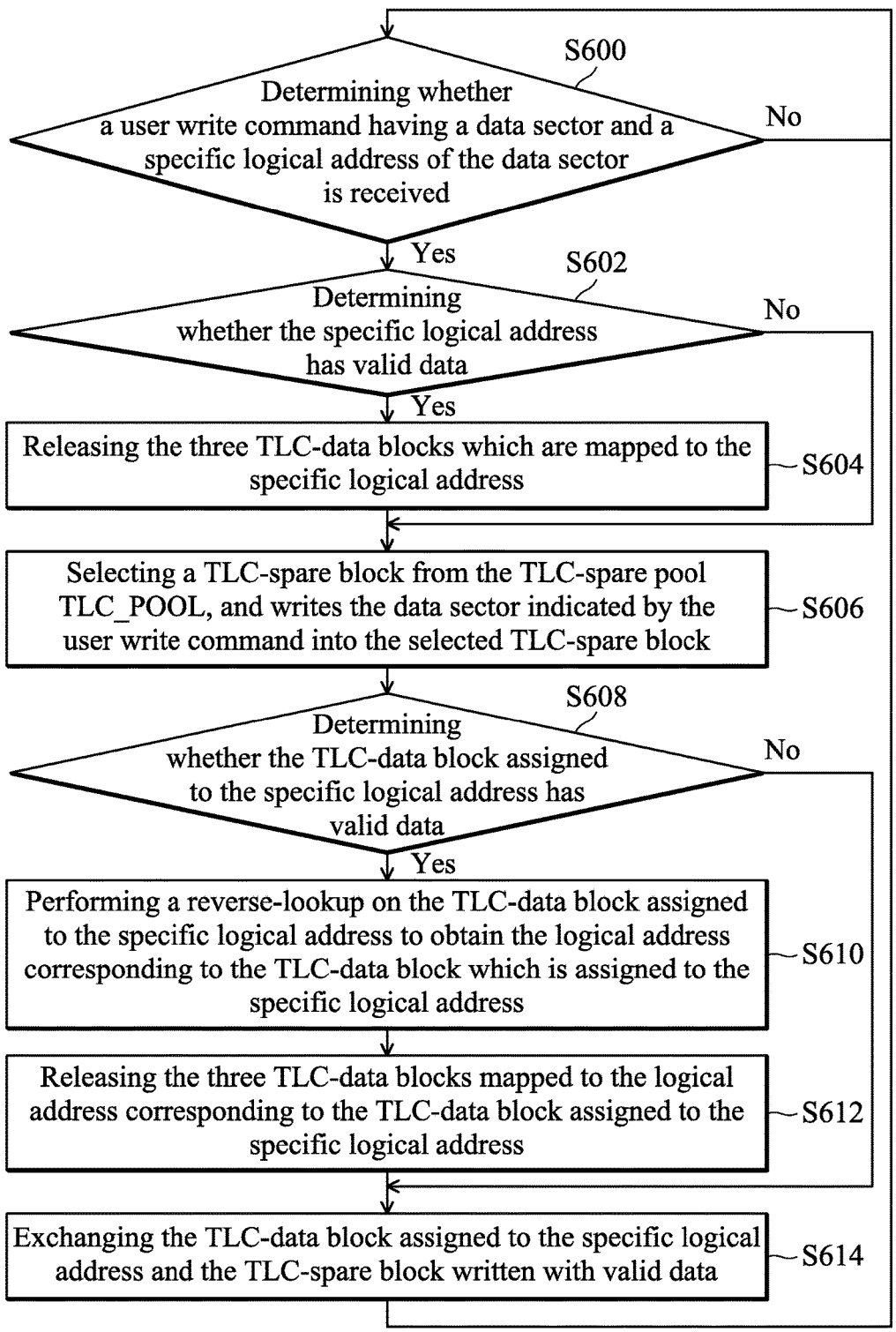
FIG. 6 is a flowchart of a data maintenance method constructed in accordance with another embodiment.

FIG. 6 is another flowchart of a data maintenance method constructed in accordance with an embodiment. The data maintenance method is applied to the data storage device 140 of FIG. 1, wherein the data maintenance method is arranged to program the sub-prewrite data sector which is written into the TLC-data blocks into at least one of the TLC-spare blocks TLC_SP_0~TLC_SP_M in the second stage by the controller 160, wherein the steps of programing the prewrite data sector stored in the TLC-data blocks are crisscross with the steps of the write operation indicated by the user's write commands. Namely, the controller 160 programs the data stored in the TLC-data block indicated by a user write command into a first TLC-spare block according to the user write command arranged to write a logical address. The process starts at step S600.

In step S600, the controller 160 determines whether a user write command having a data sector and a specific logical address of the data sector is received. When the controller 160 receives the user write command, the process goes to step S602, otherwise the controller 160 continues to determine whether a user write command having a data sector and a specific logical address of the data sector is received.

Next, in step S602, the controller 160 determines whether the specific logical address has valid data. When the specific logical address has valid data, the process goes to step S604, otherwise the process goes to step S606.

In step S604, the controller 160 releases the three TLC-data blocks which are mapped to the specific logical address. More specifically, when the specific logical address has valid data and the user write command is arranged to update a specific logical address, the controller 160 locates the three TLC-data blocks mapped to the specific logical address, and selects a TLC-spare block from the TLC-spare pool TLC_POOL to program the data stored in the three TLC-data blocks mapped to the specific logical address into the selected TLC-spare block by the TLC storage mode. Next, the controller 160 temporarily maps the programmed TLC-spare block to the specific logical address until the TLC block, which is written with the data indicated by the user write command, is mapped to the specific logical address, such that the specific logical address will keep the original data if a power-off event occurs before the new data is written, but it is not limited thereto.

Next, in step S606, the controller 160 selects a TLC-spare block from the TLC-spare pool TLC_POOL, and writes the data sector indicated by the user write command into the selected TLC-spare block. It should be noted that, in some embodiments, the controller 160 writes the data sector indicated by the user command into three of the SLC blocks in the SLC-spare pool SLC_POOL by the SLC storage mode first, and programs the data stored in the three written SLC blocks into a selected TLC-spare block by the TLC storage mode after. More specifically, the controller 160 writes the data sector into a first SLC-spare block, a second SLC-spare block and a third SLC-spare block in the SLC-spare pool SLC_POOL by the SLC storage mode first, and write the data sector stored in the first SLC-spare block, the second SLC-spare block and the third SLC-spare block into a first TLC-spare block by the TLC storage mode.

Next, in step S608, the controller 160 further determines whether the TLC-data block assigned to the specific logical address has valid data. When the TLC-data block assigned to the specific logical address has valid data, the process goes to step S610, otherwise, the process goes to step S614. Namely, in step S608, the controller 160 further determine whether the TLC-data block assigned to the specific logical address is mapped to other logical addresses. When the TLC-data block assigned to the specific logical address is mapped to other logical addresses, the process goes to S610, otherwise, the process goes to S614.

In step S610, the controller 160 performs a reverse-lookup on the TLC-data block assigned to the specific logical address to obtain the logical address corresponding to the TLC-data block which is assigned to the specific logical address.

Next, in step S612, the controller 160 releases the three TLC-data blocks mapped to the logical address corresponding to the TLC-data block assigned to the specific logical address. For example, in an embodiment of FIG. 5, the controller 160 determines that the first TLC-data block F_2, which is assigned to the first logical address H_2 (the specific logical address), of the TLC-data blocks F_1~F_N has valid data in step S608. In this embodiment, the first TLC-data block F_2 is written with the valid data of the second logical address H_302. Therefore, the controller 160 performs a reverse-lookup to obtain a second logical address H_302 corresponding to the first TLC-data block F_2 of the logical addresses H_1~H_N (step S610). Namely, the controller 160 determines that the first TLC-data block F_2 (specific logical address) is mapped to other addresses in step S608. In this embodiment, the first TLC-data block F_2 is mapped to the second logical address H_302. Therefore, the controller 160 performs a reverse-lookup to obtain a second logical address H_302 corresponding to the first TLC-data block F_2 (step S610). Next, in step S612, the controller 160 programs the data stored in the first TLC-data block F_2, the second TLC-data block F_302 and the third TLC-data block F_602, which are mapped to the second logical address H_302, into another TLC-spare block (such like the second TLC-spare block TLC_SP_2) in the TLC-spare pool TLC_POOL by the TLC storage mode to release the first TLC-data block F_2, the second TLC-data block F_302 and the third TLC-data block F_602. Next, the controller 160 determines whether the TLC-data block F_302 which is assigned to the second logical address H_302 has valid data. Namely, the controller 160 determines whether the TLC-data block F_302 which is assigned to the second logical address H_302 is mapped to any logical address. In this embodiment, the third TLC-data block F_302 is released when programing the second logical address H_302. Therefore, the controller 160 exchanges the programed second TLC-spare block TLC_SP_2 and the TLC-data block F_302 assigned to the second logical address H_302 to map the programed second TLC-spare block TLC_SP_2 to the second logical address H_302 and push the TLC-data block F_302 assigned to the second logical address H_302 into the TLC-spare pool TLC_POOL. In other embodiments, when the TLC-data block F_302 assigned to the second logical address H_302 has valid data, the controller 160 can repeat the above steps to release the TLC-data block F_302. In the above steps, the controller 160 programed the second logical address H_302, and released the first TLC-data block F_2 assigned to the first logical address H_2 and other two TLC-data blocks mapped to the second logical address H_302 during the process of programing the second logical address H_302.

Next, in step S614, the controller 160 exchanges the TLC-data block assigned to the specific logical address and the TLC-spare block written with valid data to map the TLC-spare block written with the valid data to the specific logical address and push the TLC-data block assigned to the specific logical address into the TLC-spare pool TLC_POOL.

As described above, the data storage device and the data maintenance method may write data into TLC blocks in a way that is not in accordance with the order of the logical addresses, and arrange the data stored in the SLC blocks in a specific method in a second stage.

Data transmission methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a flash memory, having a plurality of SLC (Single-Level Cell)-spare blocks, a plurality of TLC (Triple-Level Cell)-data blocks and a plurality of TLC-spare blocks; and
   a controller, receiving a first data sector and a first logical address of the first data sector, writing the first data sector into a first TLC-spare block, and determining whether a first TLC-data block corresponding to the first logical address has valid data, wherein when the first TLC-data block has valid data, the controller further performs a reverse-lookup to obtain a second logical address corresponding to the first TLC-data block, deletes mapping relationships between the second logical address and the first TLC-data block, a second TLC-data block and a third TLC-data block which are mapped to the second logical address, and maps the first TLC-spare block to the first logical address.

2. The data storage device as claimed in claim 1, wherein when the first TLC-data block does not have valid data, the controller maps the first TLC-spare block to the first logical address, and deletes a mapping relationship between the first logical address and the first TLC-data block.

3. The data storage device as claimed in claim 1, wherein the controller further determines whether the first logical address has valid data, when the first logical address has valid data, the controller further deletes mapping relationships between the first logical address and the TLC-data blocks which are mapped to the first logical address.

4. The data storage device as claimed in claim 1, wherein the controller writes the first data sector into a first SLC-spare block, a second SLC-spare block and a third SLC-spare block in the SLC-spare pool by an SLC storage mode, and writes the data stored in the first SLC-spare block, the second SLC-spare block and the third SLC-spare block into the first TLC-spare block by a TLC storage mode.

5. The data storage device as claimed in claim 1, wherein in a first stage, the controller writes a first sub-prewrite data sector, a second sub-prewrite data sector and a third sub-prewrite data sector of a prewrite data sector into the first TLC-data block, the second TLC-data block and the third TLC-data block by an SLC storage mode, and maps the first TLC-data block, the second TLC-data block and the third TLC-data block to the first logical address.

6. The data storage device as claimed in claim 5, wherein the first data sector and the first logical address is received by the controller in a second stage.

7. The data storage device as claimed in claim 6, wherein the first stage is a Production Phase, the second stage, which is after the first stage, is an Integration Phase, and the data storage device goes through a high-temperature soldering between the first stage and the second stage.

8. A data maintenance method, applied to a data storage device having a plurality of SLC (Single-Level Cell)-spare blocks, a plurality of TLC (Triple-Level Cell)-data blocks and a plurality of TLC-spare blocks, comprising:

receiving a first data sector and a first logical address of the first data sector, writing the first data sector into a first TLC-spare block;
   determining whether a first TLC-data block corresponding to the first logical address has valid data;
   when the first TLC-data block has valid data, performing a reverse-lookup to obtain a second logical address corresponding to the first TLC-data block;
   deleting mapping relationships between the second logical address and the first TLC-data block, a second TLC-data block and a third TLC-data block which are mapped to the second logical address; and
   mapping the first TLC-spare block to the first logical address.

9. The data maintenance method as claimed in claim 8, further comprising:
   when the first TLC-data block does not have valid data, mapping the first TLC-spare block to the first logical address, and deleting a mapping relationship between the first logical address and the first TLC-data block.

10. The data maintenance method as claimed in claim 8, further comprising:
    determining whether the first logical address has valid data; and
    when the first logical address has valid data, deleting mapping relationships between the first logical address and the TLC-data blocks which are mapped to the first logical address.

11. The data maintenance method as claimed in claim 8, wherein the step of writing the first data sector into the first TLC-spare block further comprises:
    writing the first data sector into a first SLC-spare block, a second SLC-spare block and a third SLC-spare block in the SLC-spare pool by an SLC storage mode; and
    writing the data stored in the first SLC-spare block, the second SLC-spare block and the third SLC-spare block into the first TLC-spare block by a TLC storage mode.

12. The data maintenance method as claimed in claim 8, wherein in a first stage the data maintenance method further comprises:
    writing a first sub-prewrite data sector, a second sub-prewrite data sector and a third sub-prewrite data sector of a prewrite data sector into the first TLC-data block, the second TLC-data block and the third TLC-data block by an SLC storage mode; and
    mapping the first TLC-data block, the second TLC-data block and the third TLC-data block to the first logical address.

13. The data maintenance method as claimed in claim 12, wherein the first data sector and the first logical address is received in a second stage.

14. The data maintenance method as claimed in claim 13, wherein the first stage is the Production Phase, the second stage, which is after the first stage, is the Integration Phase, and the data storage device goes through a high-temperature soldering between the first stage and the second stage.

* * * * *